United States Patent
Sugawara

(10) Patent No.: US 7,581,149 B2
(45) Date of Patent: Aug. 25, 2009

(54) SCAN CHAIN EXTRACTING METHOD, TEST APPARATUS, CIRCUIT DEVICE, AND SCAN CHAIN EXTRACTING PROGRAM

(75) Inventor: Osamu Sugawara, Sumida-ku (JP)

(73) Assignee: Fujitsu Limited, Kawasaki (JP)

( * ) Notice: Subject to any disclaimer, the term of this patent is extended or adjusted under 35 U.S.C. 154(b) by 410 days.

(21) Appl. No.: 11/410,155

(22) Filed: Apr. 25, 2006

(65) Prior Publication Data

US 2007/0174747 A1     Jul. 26, 2007

(30) Foreign Application Priority Data

Jan. 23, 2006   (JP) .............................. 2006-014401

(51) Int. Cl.
*G01R 31/28* (2006.01)
(52) U.S. Cl. ...................... 714/726; 714/729
(58) Field of Classification Search ................ 714/726, 714/729, 741; 716/4; 703/14
See application file for complete search history.

(56) References Cited

U.S. PATENT DOCUMENTS

| | | | | |
|---|---|---|---|---|
| 5,828,579 | A * | 10/1998 | Beausang | 716/2 |
| 5,860,105 | A * | 1/1999 | McDermott et al. | 711/135 |
| 6,185,721 | B1 * | 2/2001 | Hosokawa | 716/5 |
| 6,557,129 | B1 * | 4/2003 | Rajski et al. | 714/729 |
| 6,567,943 | B1 * | 5/2003 | Barnhart et al. | 714/727 |
| 6,671,870 | B2 * | 12/2003 | Souef et al. | 716/18 |
| 6,970,815 | B1 * | 11/2005 | Bombal et al. | 703/15 |
| 7,234,090 | B2 * | 6/2007 | Blasi et al. | 714/726 |
| 7,386,775 | B2 * | 6/2008 | Birmiwal et al. | 714/729 |
| 2002/0124217 | A1 | 9/2002 | Hiraide et al. | |
| 2003/0115522 | A1 * | 6/2003 | Nadeau-Dostie et al. | 714/726 |
| 2005/0229123 | A1 * | 10/2005 | Wang et al. | 716/4 |

FOREIGN PATENT DOCUMENTS

| | | |
|---|---|---|
| JP | 5-19022 | 1/1993 |
| JP | 5-40151 | 2/1993 |
| JP | 11-66109 | 3/1999 |

(Continued)

OTHER PUBLICATIONS

Jas et al., "Hybrid BIST Based on Weighted Pseudo-Random Testing: a New Test Resource Partitioning Scheme", IEEE Proceedings, VTS 2001, Apr. 29-May 3, 2001, pp. 2-8.*

(Continued)

*Primary Examiner*—Cynthia Britt
(74) *Attorney, Agent, or Firm*—Staas & Halsey LLP

(57) ABSTRACT

A scan-chain extracting method of the present invention includes a defining step of defining control-circuit scan chains provided in a test control circuit; an initial-value setting step of setting an initial value for the sequence circuit devices of the control-circuit scan chains; a state setting step of setting the scan chains to through states; an extracting step of extracting data regarding the scan chains; a determining step of determining whether or not data regarding all the scan chains have been extracted; and a changing step of changing the initial value for the sequence circuit devices included in the test control circuit connected to the sequence circuit devices located at the start points of the scan chains, when it is determined that not all data regarding the scan chains have been extracted.

7 Claims, 10 Drawing Sheets

FOREIGN PATENT DOCUMENTS

| | | |
|---|---|---|
| JP | 2002-236144 | 8/2002 |
| JP | 2004-178153 | 6/2004 |

OTHER PUBLICATIONS

Barnhart et al., "OPMISR: The Foundation for Compressed ATPG Vectors", IEEE Proceedings TC 2001, Oct. 30-Nov. 1, 2001.*

"A design for testability technique for RTL circuits using control/data flow extraction" Ghosh et al. Computer-Aided Design, 1996, ICCAD-96. Digest of Technical Papers., 1996 IEEE/ACM International Conference on Publication Date: Nov. 10-14, 1996 On pp. 329-336 ISBN: 0-8186-7597-7 INSPEC Accession No. 5465437.*

* cited by examiner

SCAN CHAIN EXTRACTING METHOD, TEST APPARATUS, CIRCUIT DEVICE, AND SCAN CHAIN EXTRACTING PROGRAM

BACKGROUND OF THE INVENTION

1. Field of the Invention

The present invention relates to a method and program for checking the presence/absence of errors in test patterns used in a testing method for detecting manufacture failures in integrated circuits, such as LSIs (large scale integrations).

2. Description of the Related Art

Checking of manufacture failures in LSIs requires a great number of test patterns. When an LSI includes sequence circuit devices, for example, flip flops and/or latches, the complexity of creating the test patterns further increases.

Accordingly, scan design is typically employed for LSIs. In LSIs employing scan design, sequence circuit devices (mainly, flip flops) in each LSI are used to form scan chains, test patterns are shifted in through the scan chains, and the values of the scan chains are read out after clock application.

For example, a failure checking method called "parallel scan chain approach" has been conventionally used for checking manufacture failures in LSIs.

FIG. 1 is a schematic diagram of a parallel scan chain.

An LSI 100 includes a test control circuit 101 and flip flops (FFs) 102, 103, 104, and 105. Multiple flip flops including the flip flops 102 and 103 constitute a scan chain 106 and multiple flip flops including the flip flops 104 and 105 similarly constitute a scan chain 107. In FIG. 1, scan chains other than the scan chains 106 and 107, constituted by flip flops, are also provided in the LSI 100. In the case of a parallel scan chain configuration, up to 16 scan chains are provided. Each scan chain is connected to the test control circuit 101 and LSI external input/output pins.

The parallel scan chains 106 and 107 will be described below for the sake of clarity of the operation of parallel scanning and only associated input/output pins and so on provided externally to the LSI will be described. Other parallel scan chains, which are provided in the LSI 100 but are not illustrated, operate in the same manner as the parallel scan chains 106 and 107, which are described below. This description, therefore, does not intend to mean that the parallel scan chains are limited to two parallel scan chains 106 and 107.

First, all state values in the LSI 100 are set to an indefinite value "X" to perform initialization. Herein, setting to the indefinite value means that whether the initial state values in the LSI 100 take 1 or 0 is unknown. Such setting is necessary for improving the accuracy of checking.

In order to extract information of the parallel scan chains 106 and 107, a test pattern is input from LSI external pins 108 and 109 dedicated to the test circuit 101 to perform simulation and the test control circuit 101 is set to a scan shift state.

The test control circuit 101 includes a scan shift clock generator (not shown), which supplies clock signals, for example, typically, an ACK (A clock) signal and a BCK (B clock) signal, directly to the flip flops to perform simulation and signal paths from scan-in (SI) pins to scan-out (SO) pins of the flip flops 102 to 105 are set to through states.

Since the scan shift clock generator (not shown) is provided in the test control circuit 101 in this case, a simulator can make a determination. The expression "through states" refer to states in which signals 0 or 1 indicating a test pattern pass through the scan flop flops 102 to 105 without inversion. The simulator, which is not shown for simplicity, inputs a test pattern to the LSI 100 to perform simulation.

When values "0" are supplied via the LSI external input pins 108 and 109 of the respective parallel scan chains 106 and 107 to perform simulation, the values "0" pass through the scan flip flops 102 to 105 without change and reach respective LSI external output pins 110 and 111 of the parallel scan chains 106 and 107, due to the through states of the scan flip flops 102 to 105.

During the signal passage, the scan flip flops are sequentially traced to thereby extract data regarding the parallel scan chains.

Thereafter, a test pattern is generated and results output from the external output pins 110 and 11 are read to thereby make it possible to detect an LSI manufacture failure.

FIG. 2 is a schematic diagram of pins of a flip flop 200 to be scanned.

Pins at the input side include a CK pin 201 for receiving a clock signal indicating the timing of data reception, a D pin 202 for receiving data, an SI pin 205 for receiving parallel scan data, and an ACK pin 203 and a BCK pin 204 for receiving signals for shifting the data. Pins at the output side include a Q pin 206 for outputting the data received from the D pin 202 according to the clock signal received via the CK pin 201 and an SO pin 207 for outputting the scan data received via the SI pin 205. Typically, when the shift clock signals are alternately input via the ACK pin 203 and the BCK pin 204 once, the flip flop 200 shifts the parallel scan data.

FIG. 3 is a schematic diagram showing a case in which data regarding parallel scan chains in the related art is extracted.

More specifically, FIG. 3 is an enlarged partial diagram of the parallel scan chain portion (106 or 107) shown in FIG. 1.

Each parallel scan chain is constituted by multiple flip flops, such as flip flops 301, 302, and 303. In this case, flip flops other than the flip flops 301, 302, and 303 may also be provided and the number of flip flops constituting the parallel scan chain is not limited to 3.

With respect to all flip flops constituting the parallel scan chain, the ACK signal and the BCK signal input to the flip flops are turned on and "0" is input to the parallel scan chain via the LSI external input pin to execute simulation. "0" illustrated before each flip flop shown in FIG. 3 indicates that "0" is input to the flip flop and the arrow indicates that "0" is transmitted through the parallel scan chain.

All parallel scan chains are directly connected to the LSI external pins. In the presence of 16 scan chains, the number of LSI external pins provided at each of the input side and the output side is 16.

Thus, when the scan flip flops, which are provided between the LSI external input pins and the LSI external output pins, are traced starting at the LSI external input pins, data regarding all the parallel scan chains can be obtained. The "tracing" herein refers to inputting a test pattern through the external input pins and checking the states of the parallel scan chains.

As related art, Japanese Patent Application Laid-Open No. 2002-236144 discloses a technology in which a pattern modifier that modifies, in response to an external input, a test pattern generated by a pattern modifier and that inputs the modifier test pattern to shift registers. Increasing or reducing the number of scan paths, which are constituted by the shift registers, allows test time for an integrated circuit (e.g., an LSI) to be reduced. In this case, since only significant data portions are supplied from a tester and modified, the amount of data stored in the tester can be reduced.

This arrangement allows high-quality testing to be executed in a short period of time, and allows high-quality testing to be conducted without imposing stringent design restrictions on a designer and without requiring a high-quality tester.

Other than the above-described parallel scanning, BAST (Built-in-scan-test Aided Scan Test) scanning is also available as a scanning method. Unlike the parallel scanning, the BAST scanning allows the provision of a larger number of BAST scan chains than the number of external input/output pins and allows the scanning of a larger number of scan chains than those for the parallel scanning.

However, in an LSI having BAST scan chains, the number of external input pins does not correspond to the number of BAST scan chains and thus a test pattern cannot be transmitted through the LSI external input/output pins, unlike the parallel scan chains. This makes it impossible to easily extract data regarding the scan chains.

SUMMARY OF THE INVENTION

The present invention has been made in view of the foregoing situation, and an object of the present invention is to easily extract data regarding BAST scan chains without supplying BAST-circuit-related information from the outside of an LSI.

The present invention provides a scan-chain extracting program for extracting data regarding scan chains to which a test pattern for testing an integrated circuit is input, the scan chains being constituted by sequence circuit devices. The scan-chain extracting program causes a computer to execute: a control-circuit scan-chain defining step of defining control-circuit scan chains constituted by sequence circuit devices provided in a test control circuit for controlling inputting of the test pattern; an initial-value setting step of setting an initial value for the sequence circuit devices constituting the control-circuit scan chains; and a state setting step of setting the scan chains to through states so that input signal values pass through the scan chains without change. The program further causes the computer to execute: a scan-chain extracting step of extracting data regarding the scan chains; an extraction determining step of determining whether or not data regarding all the scan chains provided in the integrated circuit have been extracted; and an initial-value changing step of changing the initial value for the sequence circuit devices included in the test control circuit connected to the sequence circuit devices located at the start points of the scan chains, when it is determined in the extraction determining step that not all data regarding the scan chains have been extracted.

Preferably, at least one of the control-circuit scan chains comprises sequence circuit devices that are included in a pattern modifier circuit for modifying the test pattern and inputting the modified test pattern to the scan chains.

Preferably, in the initial-value changing step, the initial value for the sequence circuit devices constituting the pattern modifier circuit is changed.

The present invention further provides a scan-chain extracting method for extracting data regarding scan chains to which a test pattern for testing an integrated circuit is input, the scan chains being constituted by sequence circuit devices. The scan-chain extracting method includes: a control-circuit scan-chain defining step of defining control-circuit scan chains constituted by sequence circuit devices provided in a test control circuit for controlling inputting of the test pattern; an initial-value setting step of setting an initial value for the sequence circuit devices constituting the control-circuit scan chains; and a state setting step of setting the scan chains to through states so that input signal values pass through the scan chains without change. The extracting method further includes: a scan-chain extracting step of extracting data regarding the scan chains; an extraction determining step of determining whether or not data regarding all the scan chains provided in the integrated circuit have been extracted; and an initial-value changing step of changing the initial value for the sequence circuit devices included in the test control circuit connected to the sequence circuit devices located at the start points of the scan chains, when it is determined in the extraction determining step that not all data regarding the scan chains are extracted.

The present invention further provides a test apparatus for extracting data regarding scan chains to which a test pattern for testing an integrated circuit is input, the scan chains being constituted by sequence circuit devices. Test apparatus includes: initial-value setting means for setting an initial value for a test control circuit for controlling inputting of the test pattern, control-circuit scan chains constituted by sequence circuit devices provided in the test control circuit, and the sequence circuit devices constituting the control circuit scan chains; state setting means for setting the scan chains to through states so that input signal values pass through the scan chains without change; and scan-chain extracting means for extracting data regarding the scan chains. The test apparatus further includes: extraction determining means for determining whether or not data regarding all the scan chains provided in the integrated circuit have been extracted; and initial-value changing means for changing the initial value for the sequence circuit devices included in the test control circuit connected to the sequence circuit devices located at the start points of the scan chains, when the extraction determining means determines that not all data regarding the scan chains have been extracted.

According to the present invention, it is possible to easily extract data regarding BAST scan chains without externally supplying BAST circuit information.

Since BAST scan shift processing required for checking an LSI-shipment determination test pattern can be eliminated by using the information of the BAST scan chains, the speed of scan simulation can be increased.

Thus, the present invention can substantially reduce time for checking a shipment determination pattern.

DESCRIPTION OF THE PREFERRED EMBODIMENT

Figure 1:
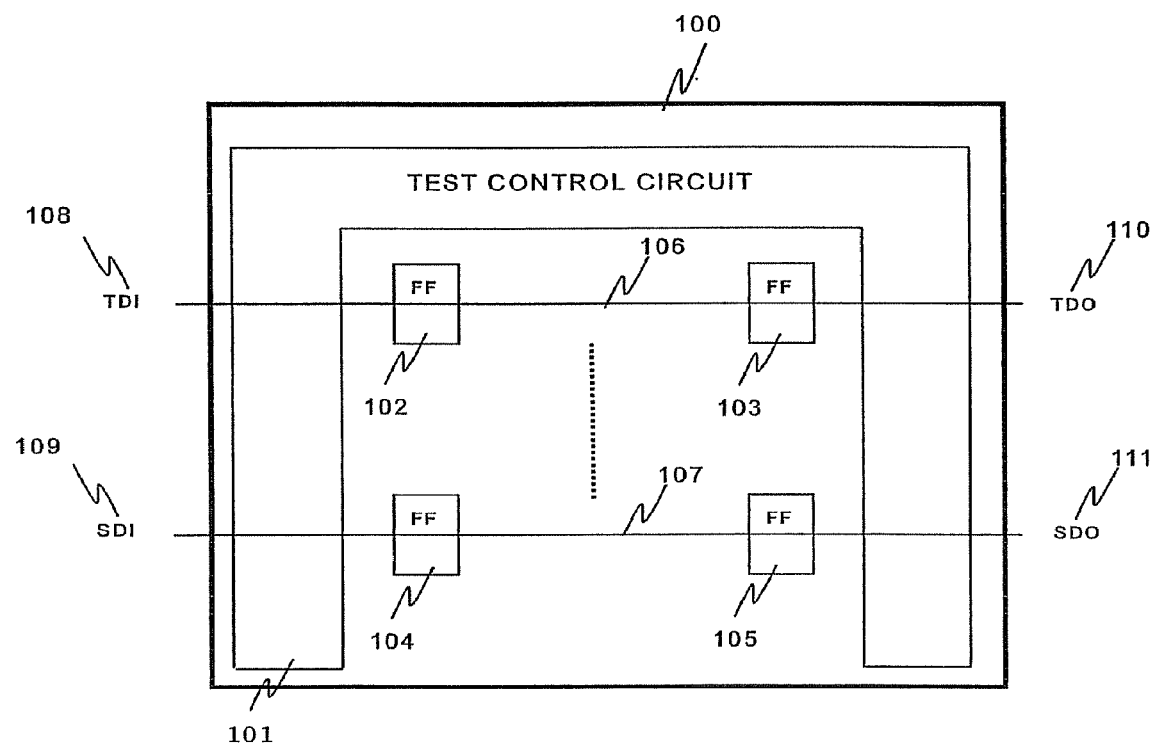
FIG. 1 is a block diagram of parallel scan chains.
Figure 2:
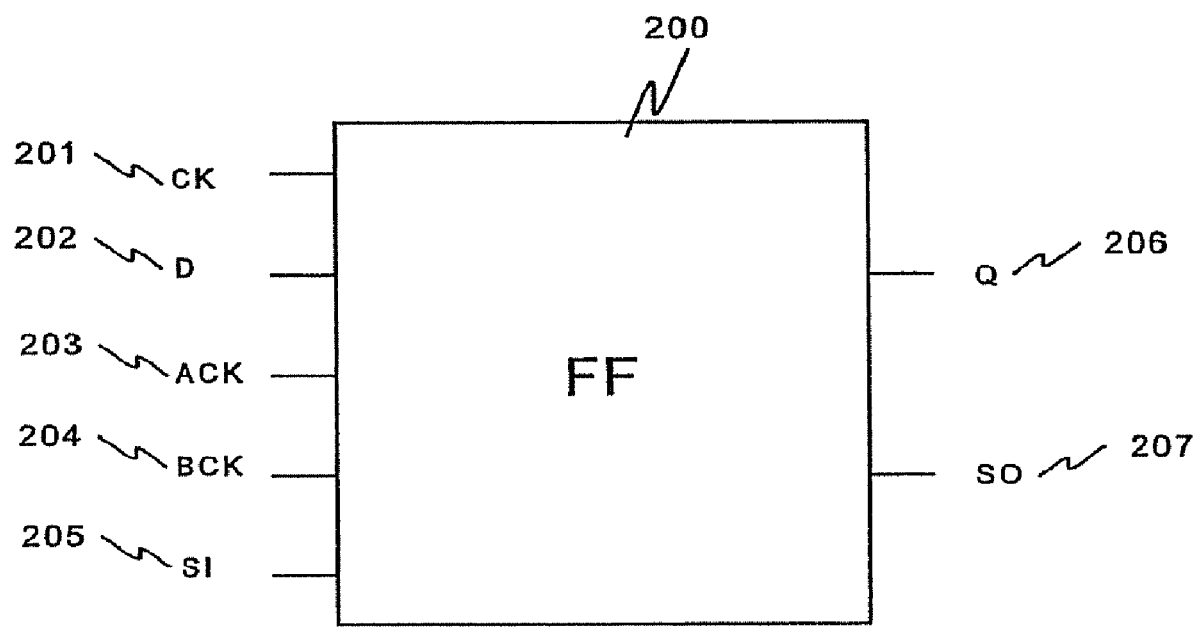
FIG. 2 is a diagram showing pins of a flip flop to be scanned.
Figure 3:
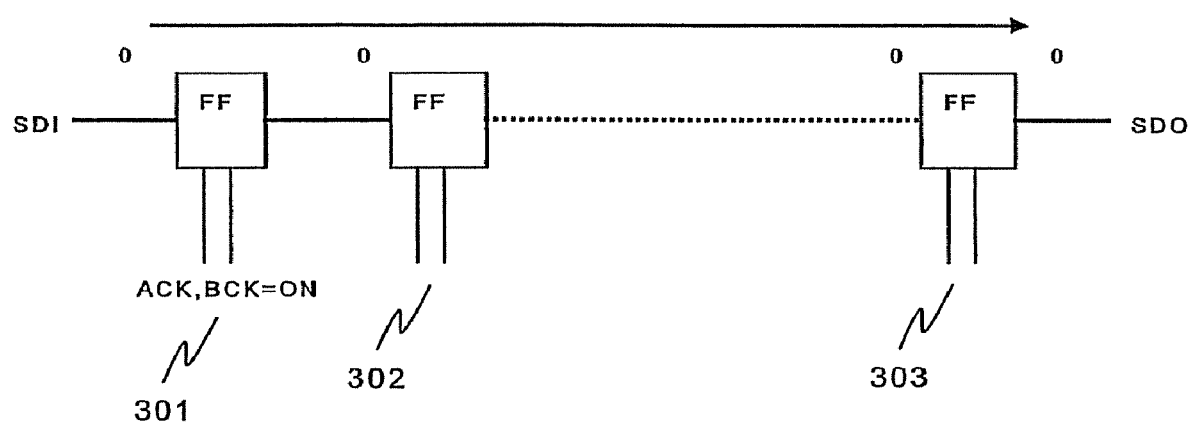
FIG. 3 is a schematic diagram showing a case in data regarding a parallel scan chain is extracted in related art.
Figure 4:
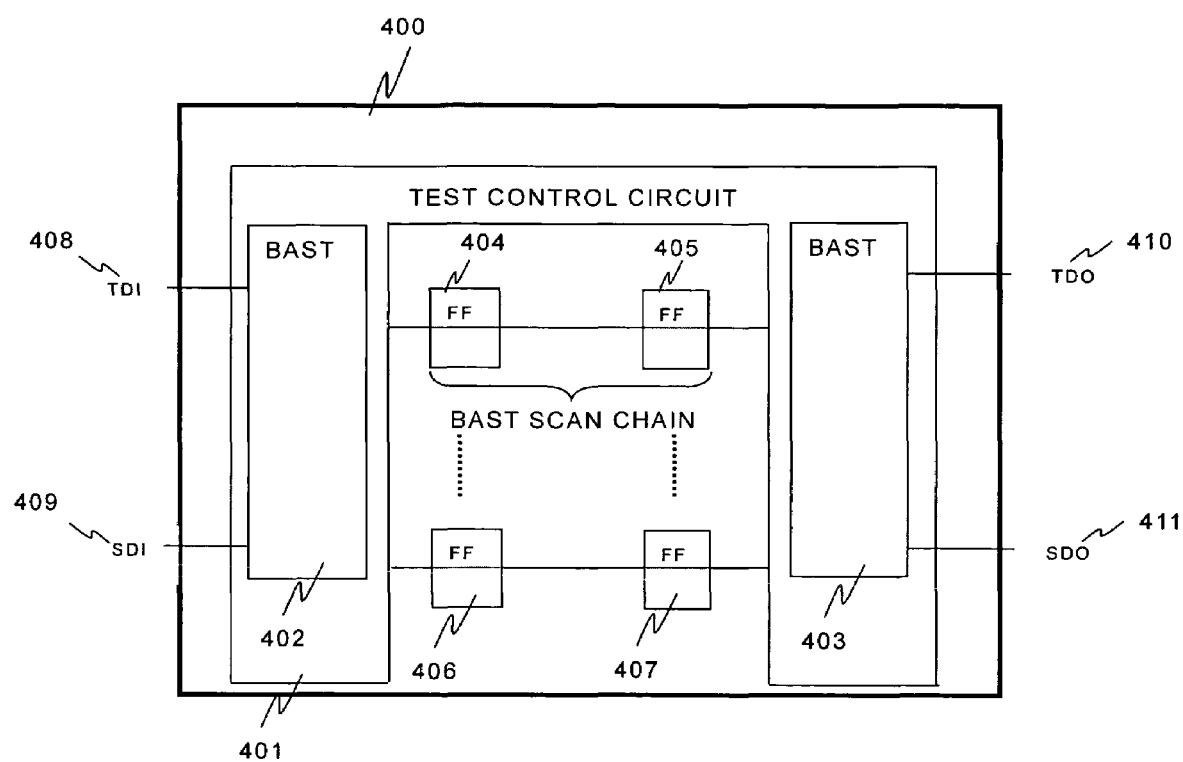
FIG. 4 is a block diagram of an LSI according to one embodiment of the present invention.

FIG. 4 is a block diagram of an LSI according to one embodiment of the present invention.

An LSI 400 includes a test control circuit 401, into which BAST circuits 402 and 403 are incorporated. The BAST circuits 402 and 403 operate as portions of the test control circuit 401. In the present embodiment, the BAST circuit 402 includes a pseudo-random-number generator circuit (LFSR) and a pattern modifier circuit (MODIFIER). The BAST circuit 403 includes an indefinite-value mask circuit (XMASK) and a scan output compressing circuit (MISR). In the present embodiment, a scan chain into which a test pattern is shifted and from which values of the scan chain are read out after the clock application, the scan chain being constituted by sequence circuit devices, is referred to as a "BAST scan chain".

The LSI 400 in the present embodiment has 128 BAST scan chains (only two of which are shown in FIG. 4). One scan chain is constituted by a series of flip flops, including flip flops 404 and 405, and another scan chain is also constituted by flip flops 406 and 407. The LSI 400 has 9 input pins for inputting a test pattern, and a TDI pin 408 and an SDI pin 409 of the input pins are illustrated in FIG. 4. Also, the LSI 400 has 8 external output pins, and only a TDO pin 410 and an SDO pin 411 are illustrated in FIG. 4. Naturally, the number of input pins and the number of output pins are not limited to the illustrated example and thus may be other numbers.

Figure 5:
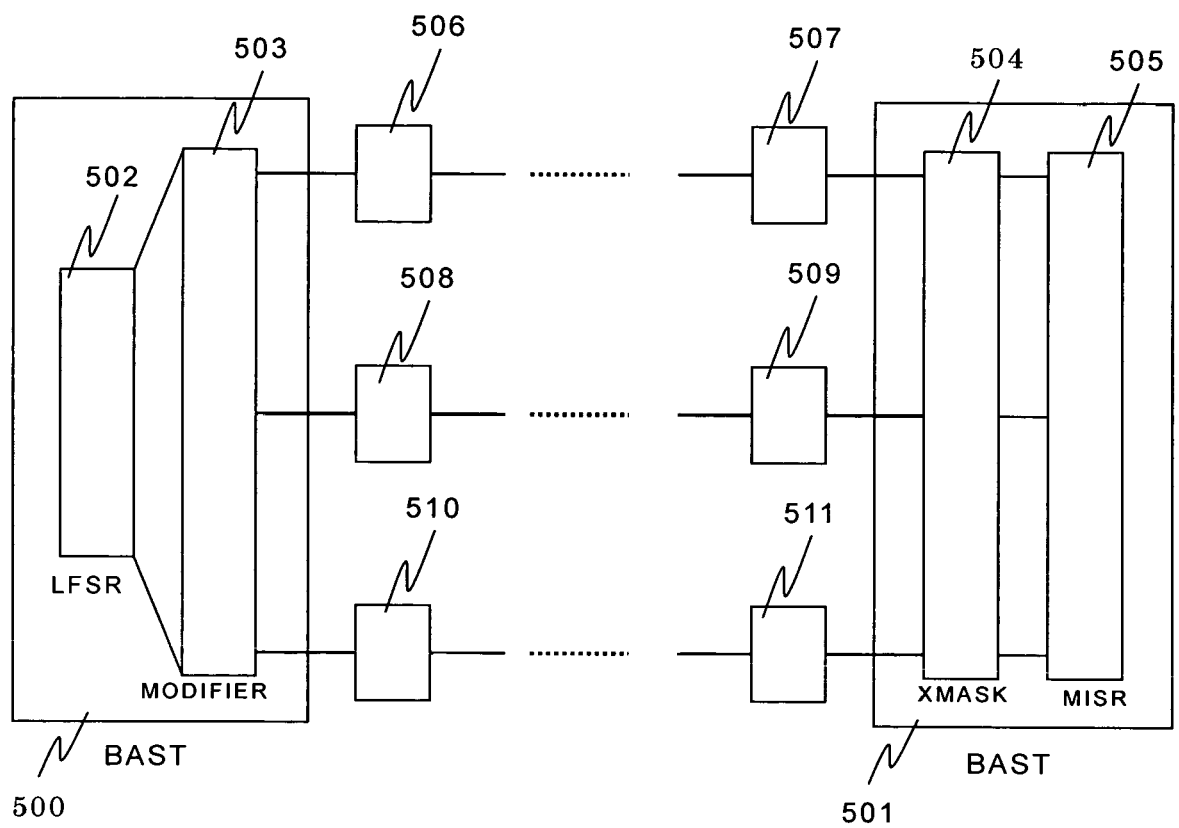
FIG. 5 is a block diagram showing the connections between BAST circuits and BAST scan chains.

FIG. 5 is a block diagram showing the connections of BAST circuits and BAST scan chains.

In the present embodiment, 128 BAST scan chains are provided between a pattern modifier circuit (MODIFIER) 503 in a BAST circuit 500 (corresponding to the BAST circuit 402 shown in FIG. 4) and an indefinite-value mask circuit (XMASK) 504 in a BAST circuit 501 (corresponding to the BAST circuit 403).

The BAST circuit 500 includes a pseudo-random-number generator circuit (LFSR) 502 and the pattern modifier circuit 503, and the BAST circuit 501 includes the indefinite-value mask circuit 504 and a scan output compressing circuit 505.

The pseudo-random generator circuit 502 and the pattern modifier circuit 503, which are included in the BAST circuit 500, and the indefinite-value mask circuit 504 and the scan output compressing circuit 505, which are included in the BAST circuit 501, include respective scan chains constituted by corresponding scan flip flops. Those circuits are connected between the LSI external pin TDI and the LSI external pin TDO via the test control circuit.

The pseudo-random-number generator circuit 502 generates a random-number pattern. Based on a control signal input via a BAST control pin (not shown) or the like provided in the LSI, the pattern modifier circuit 503 modifies a desired bit in the random-number pattern generated by the pseudo-random-number generator circuit 502. Herein, the bit modification specifically means that 0 and 1 of a bit in the pseudo-random number are inverted. Similarly to the pattern modifier circuit (MODIFIER) 503, the pseudo-random-number generator circuit (LFSR) 502 is controlled by a BAST control pin (not shown), which is an LSI external input pin.

The BAST scan chains are constituted by corresponding flip flops, including flip flops 506 to 511, and only the flips flops 506, 508, and 510 at the front-ends of the corresponding BAST scan chains and the flip flops 507, 509, and 511 at the back-ends thereof are illustrated.

The pattern modifier circuit 503, to which 128 BAST scan chains are connected, outputs a modified random-number pattern. The modified pseudo-random pattern is then input to the flip flops 506, 508, and 510 at the front-ends of the corresponding BAST scan chains.

Based on a control signal input via a control input pin or the like of the LSI, the indefinite-value mask circuit 504 masks an indefinite value (X state) of the values of the last flip flops 507, 509, and 511 of the BAST scan chains to thereby convert the indefinite state into a specified state.

The scan pattern compressing circuit (MISR) 505 is connected to the indefinite-value mask circuit 504, located at the terminating ends of the BAST scan chains, and compresses the scan-shifted values of the BAST scan chains.

The scan output compressing circuit 505 compresses and stores BAST scan output data received from the indefinite-value mask circuit 504.

A random-number pattern which is generated by the pseudo-random-number generator circuit (LFSR) 502 and whose desired bit is modified by the pattern modifier circuit 503 is input to each BAST scan chain.

Figure 6:
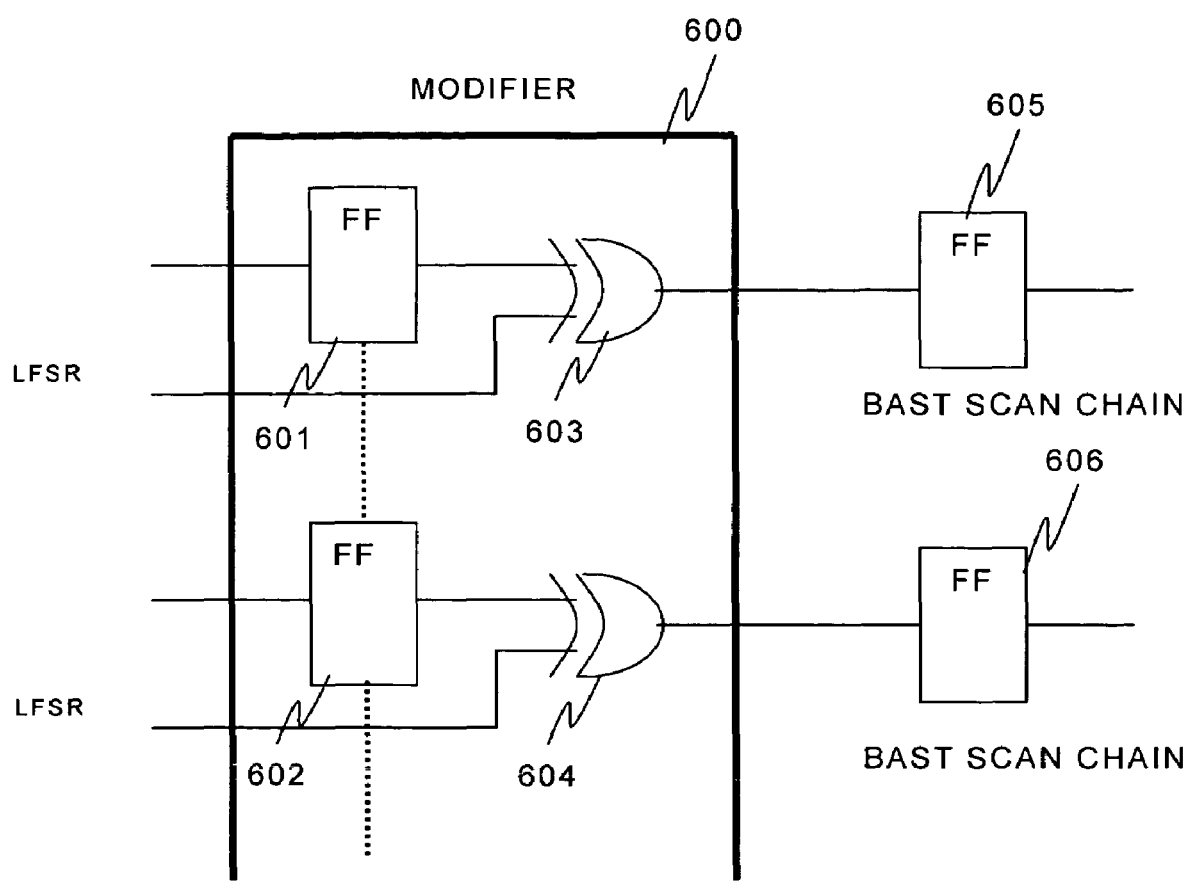
FIG. 6 is a block diagram of a pattern modifier circuit (MODIFIER)

FIG. 6 is a block diagram of the pattern modifier circuit (MODIFIER).

To modify a desired bit in the random-number pattern, a pattern modifier circuit 600 (corresponding to the pattern modifier circuit 503 shown in FIG. 5) has flip flops 601 and 602 that set random-number values constituting the random value pattern to arbitrary values and that invert the numbers.

Setting a value "1" in the flip flops 601 and 602 allows a desired bit in the random number pattern to be inverted at EOR circuits 603 and 604. While only the flip flops 601 and 602 are illustrated in FIG. 6, flip flops corresponding to the other BAST scan chains (i.e., the remaining 126 chains) are provided in the pattern modifier circuit 600, in the same manner as the flip flops 601 and 602. Similarly, other than the EOR circuits 603 and 604, 126 EOR circuits corresponding to the remaining 126 BAST scan chains are provided. Needless to say, the number of BAST scan chains, the number of flip flops in the pattern modifier circuit 600, and the number of EOR circuits in the pattern modifier circuit 600 are not limited to 128 and thus may be another number.

The pattern modifier circuit 600 is designed to correspond to 1-bit flip flops for each scan chain and the flip flops 601 and 602 receive scan-shifted values.

Figure 7:
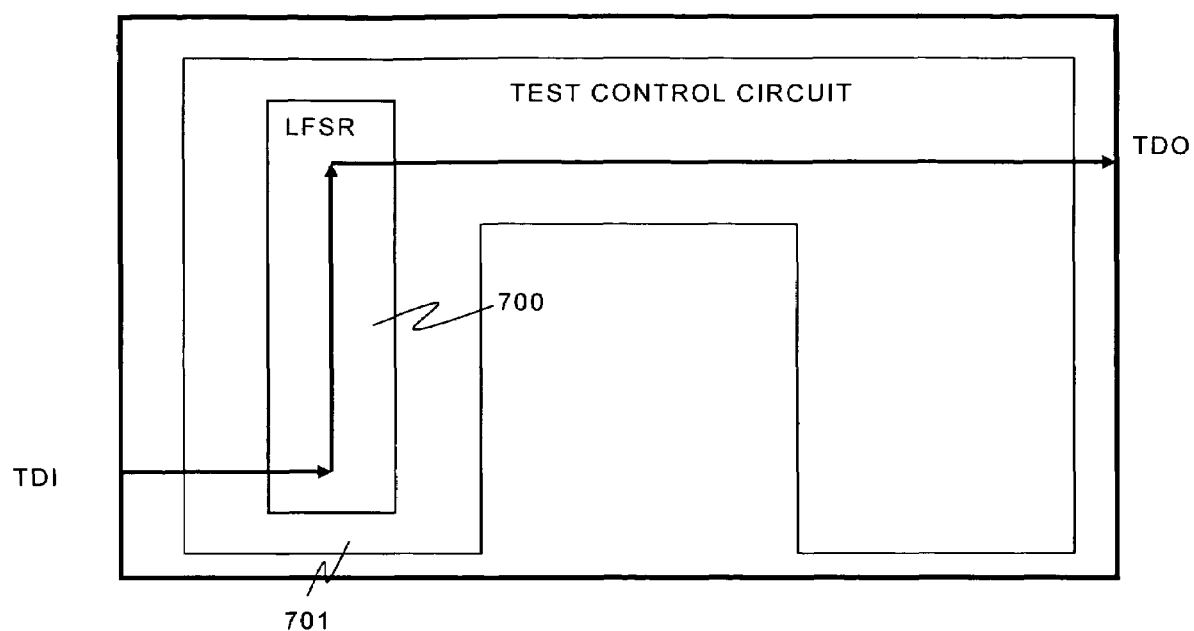
FIG. 7 is a diagram showing tracing when a pseudo-random-number generator circuit is extracted as scan chain data.

FIG. 7 is a diagram showing tracing when the pseudo-random-number generator circuit is extracted as scan chain data.

Before the start of tracing, all state values of the LSI are first set to "X" to perform initialization.

Thereafter, in order to obtain information regarding the states of the pseudo-random generator circuit, the pattern modifier circuit, the indefinite-value mask circuit, and the scan output compressing circuit, which are provided in the BAST circuits, signal values are input via a control input pin or the like and data regarding scan chains are obtained. The term "scan chains" in this case are different from the BAST scan chains and are constituted by the flip flips that are connected to the BAST scan chains and that indicate information on the correlation among the pattern modifier circuit, the indefinite-value mask circuit, the scan output compressing circuit.

Next, data regarding a scan chain (indicated by arrows shown in FIG. 7), the data being transmitted from a control input pin to an output pin through the scan chain in the pseudo-random-number generator circuit, are extracted by selecting a pseudo-random-number generator selection mode.

With respect to the pattern modifier circuit, the indefinite-value mask circuit, and the scan output compressing circuit, changing the setting of a test control circuit 701 allows extraction of corresponding scan chain information between a control input pin and an output pin, in the same manner as the pseudo-random-number generator circuit.

Next, the test control circuit 701 is operated to supply a value "0" to all the pattern modifier circuit, the indefinite-value mask circuit, and the scan output compressing circuit, simulation is performed, and setting is performed so as to prevent the operations of the functions of the pattern modifier circuit and the indefinite-value mask circuit.

In the control operation of a test control circuit 701, a value "0" is supplied to a pseudo-random-number generator circuit 700, simulation is performed, and "0" is set for the inputs of all the BAST scan chains.

The pseudo-random-number generator circuit 700 has a configuration in which, when "0" is set in all flip flops, all random values generated become "0".

Subsequently, a scan shift clock generator directly supplies clock (ACK and BCK) signals to the flip flops, which constitute the BAST scan chains, to set all the flip flops of the BAST scan chains to the through state. Consequently, the value "0" is transmitted through all the BAST scan chains, so that "0" is transmitted to the input of the scan output compressing circuit at the terminating end.

Figure 8:
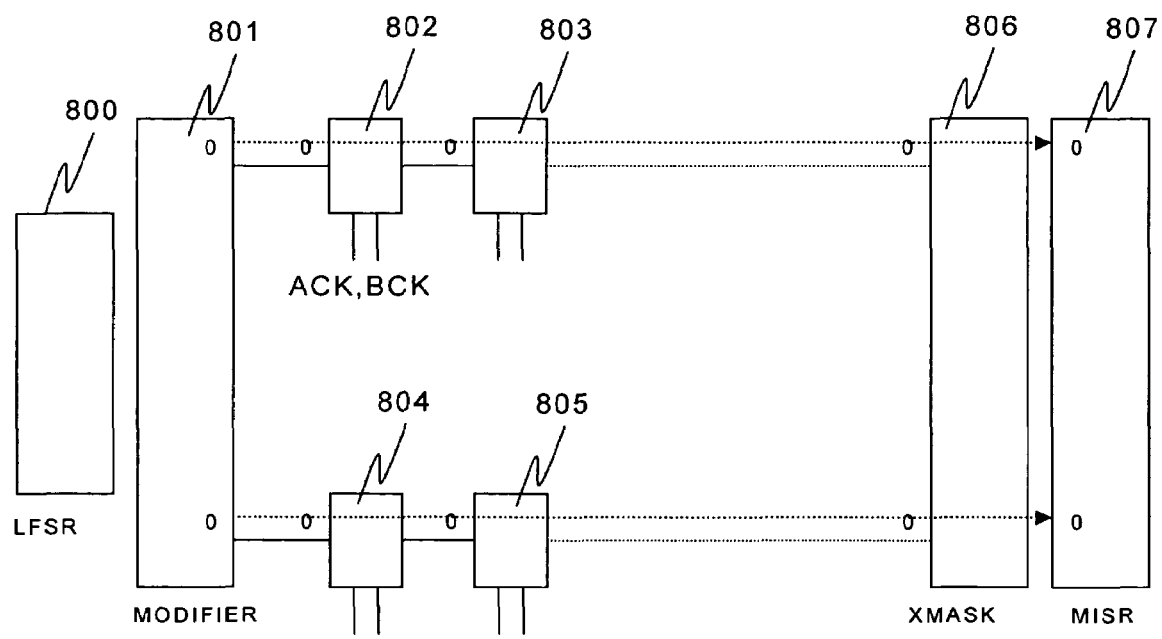
FIG. 8 is a schematic diagram showing the transmission of a value "0" between the BAST circuits.

FIG. 8 shows simulated transmission of value "0" between the BAST circuits.

A value "1" is directly set in each pattern modifier circuit flip flop, extracted in the processing illustrated in FIG. 7, and simulation is performed. Consequently, a scanned-in value modification function of the BAST circuit is activated, a value "1", which is the inverse of the value "0" set in the corresponding BAST scan chain is transmitted through the scan chain.

At this point, tracing the flip flops through which "1" is transmitted makes it possible to extract data regarding the BAST scan chain.

Figure 9:
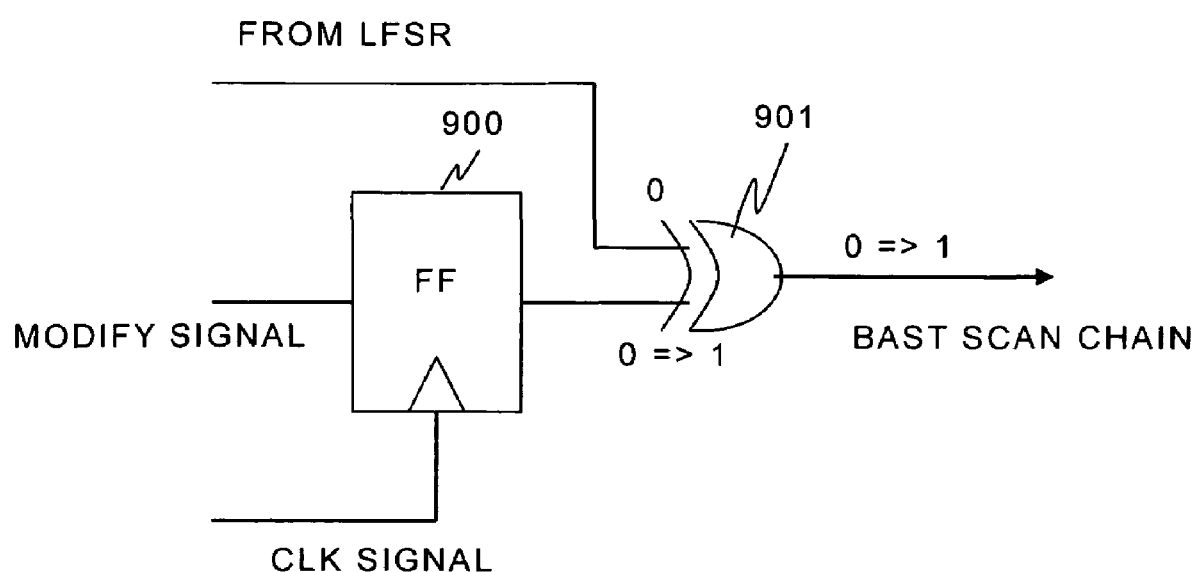
FIG. 9 is a block diagram showing a portion of the pattern modifier circuit.

FIG. 9 is a block diagram showing a portion of the pattern modifier circuit 503.

The pattern modifier circuit 503 has a flip flop 900 and an EOR logic circuit 901 with respect to one BAST scan chain.

First, for initialization, a value "0" is supplied to the pseudo-random-number generator circuit 502 to set value "0" for the input of the BAST scan chain. In the flip flop 900, "0" is set by a MODIFY signal and a CLK signal, and the test control circuit is operated to supply "0" to the whole pattern modifier circuit. In the case, the MODIFY signal and the CLK signal are input via the external input pins.

Thereafter, a value "1" is directly set as the output of the flip flop 900 and simulation is performed.

When a value "0" is input, as a random-number value, from the pseudo-random-number generator circuit to the EOR circuit 901 and "1" is input from the flip flop 900 to the EOR circuit 901, the value "0" output from the pseudo-random-number generator circuit is inverted and the resulting "1" is transmitted to the BAST scan chain. Being triggered by the inversion of the test pattern, the pattern modifier circuit 503 becomes the start point of the tracing of the BAST scan chains.

The pattern modifier circuit 503 has a total of 128 flip flops 900, and BAST scan chains are provided so as to correspond to the flip flops 900. The pattern modifier circuit 503 performs an operation as described above.

Figure 10:
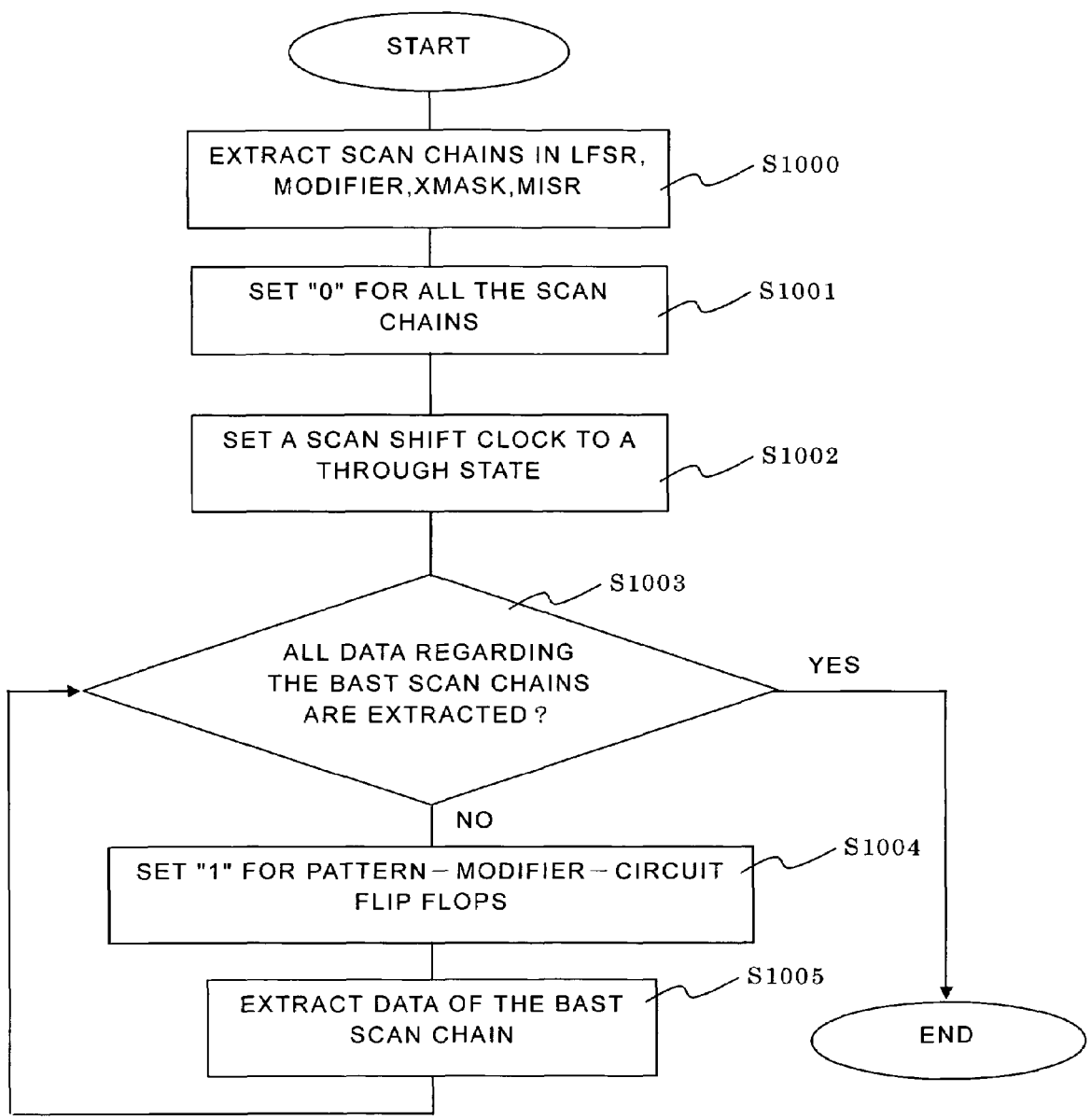
FIG. 10 is a flow chart illustrating scan-chain data extraction according to one embodiment of the present invention.

FIG. 10 is a flow chart illustrating the extraction of data regarding the scan chains.

First, in step S1000, the entire test control circuit is initialized and data regarding the scan chains in the pseudo-random-number generator circuit 502, the pattern modifier circuit 503, the indefinite-value mask circuit 504, and the scan output compressing circuit 505 in the BAST circuits are extracted, so that information on each circuit is obtained.

In step S1001, "0" is set for all the scan chains of the pseudo-random-number generator circuit 502, the pattern modifier circuit 503, the indefinite-number mask circuit 504, and the scan output compressing circuit 505. In step S1002, the scan shift clock is set to a through state. At this point, a value is set in the pseudo-random-number generator circuit 502 so that the test control circuit 401 sets a desired random number for the BAST scan chains, and the test control circuit 401 sets values so that the pattern modifier circuit 503 and the indefinite-value mask circuit 504 do not operate. The scan shift clock generator is set to put the flip flops of the BAST scan chains into through states and simulation is performed.

As a result, random number values supplied from the pseudo-random number generator circuit to the BAST scan chains are transmitted therethrough and become equal.

In step S1003, a determination is made as to whether or not all data regarding the BAST scan chains are extracted. In step S1004, a value "1" is set for the pattern-modifier-circuit flip flops corresponding to the BAST scan chains so that the value is inverted and simulation is performed. As a result, the value is inversed and transmitted through each BAST scan chain. At this point, in step S1005, the flip flops through which the value is transmitted are traced to thereby make it possible to extract data of the BAST scan chains.

This arrangement makes it possible to extract data of the scan chains without depending on the number of BAST scan chains for checking an LSI failure.

Next, modifications and other technical features of the scan-chain extracting program according to the above-described embodiment of the present invention will be described.

(1) Although the number of scan chains in the above-described embodiment is 128, the present invention is not limited thereto. For example, the number of scan chains may be another number, for example, 256.

(2) Although an LSI has been described as a device to be checked for a failure in the above-described embodiment, the present invention is not limited thereto and thus may be another type of integrated circuit.

What is claimed is:

1. A scan-chain extracting method for extracting data regarding scan chains to which a test pattern for testing an integrated circuit is input, executed by programmed processor, the scan chains being constituted by sequence circuit devices, the scan-chain extracting method comprising the steps of:

defining control-circuit scan chains constituted by the sequence circuit devices, the sequence circuit devices being disposed in a test control circuit for controlling inputting of the test pattern;

setting an initial value for the sequence circuit devices constituting the control-circuit scan chains;

setting the scan chains to through states so that input signal values pass through the scan chains without change;

extracting data regarding the scan chains;

determining whether or not all data regarding all the scan chains have been extracted, all the scan chains being provided in the integrated circuit;

changing the initial value for the sequence circuit devices of the control-circuit scan chains included in the test control circuit, when at least one of the data regarding the scan chains have not been extracted, the sequence circuit devices being connected to other sequence circuit devices located at start points of the scan chains; and extracting data regarding the scan chains by tracing the sequence circuit devices included in the integrated circuit.

2. The scan-chain extracting method according to claim 1, wherein at least one of the control-circuit scan chains comprises sequence circuit devices which are included in a pattern modifier circuit, the pattern modifier circuit modifying the test pattern and inputting the modified test pattern to the scan chains.

3. The scan-chain extracting method according to claim 2, wherein the initial value for the sequence circuit devices constituting the pattern modifier circuit is changed.

4. The scan-chain extracting method according to claim 1, wherein the initial-value is 0.

5. The scan-chain extracting method according to claim 4, wherein the initial value is changed from 0 to 1.

6. A test apparatus for extracting data regarding scan chains to which a test pattern for testing an integrated circuit is input, the scan chains being constituted by sequence circuit devices, the test apparatus comprising:

an initial-value setting unit for setting an initial value for a test control circuit for controlling inputting of the test pattern, control-circuit scan chains constituted by sequence circuit devices disposed in the test control circuit, and the sequence circuit devices constituting the control circuit scan chains; a state setting unit for setting the scan chains to through states so that input signal values pass through the scan chains without change;

a scan-chain extracting unit for extracting data regarding the scan chains; an extraction determining unit for determining whether or not all data regarding all the scan chains have been extracted, all the scan chains being provided in the integrated circuit; and an initial-value changing unit for changing the initial value for the sequence circuit devices of the control-circuit scan chains included in the test control circuit and the scan-chain extracting unit extracts data regarding the scan chains by tracing the sequence circuit devices included in the integrated circuit, when the extraction determining unit determines that at least one of the data regarding the scan chains have not been extracted, the sequence circuit devices being connected to other sequence circuit devices located at start points of the scan chains.

7. The test apparatus according to claim 6, wherein at least one of the control-circuit scan chains comprises sequence circuit devices which are included in a pattern modifier circuit, the pattern modifier circuit modifying the test pattern and inputting the modified test pattern to the scan chains.

* * * * *